United States Patent [19]
Stopyra et al.

[11] Patent Number: 6,000,559
[45] Date of Patent: Dec. 14, 1999

[54] MOUNT FOR CIRCUIT BOARD

[75] Inventors: Stephen Stopyra; Richard J. Duell, both of Syracuse; Theodore S. Bolton, Liverpool, all of N.Y.

[73] Assignee: Carrier Corporation, Farmington, Conn.

[21] Appl. No.: 09/017,067

[22] Filed: Feb. 2, 1998

[51] Int. Cl.[6] ................................................. A47F 5/00
[52] U.S. Cl. ........................................ 211/41.17; 361/752
[58] Field of Search .................................. 211/41.17, 26; 361/748, 752, 758

[56] References Cited

U.S. PATENT DOCUMENTS

| | | |
|---|---|---|
| 4,444,318 | 4/1984 | Alexander ............................ 211/41.17 |
| 5,091,826 | 2/1992 | Arnett et al. ......................... 361/752 X |
| 5,278,445 | 1/1994 | Uemura et al. ...................... 361/752 X |
| 5,497,290 | 3/1996 | Fukui et al. ............................. 361/752 |
| 5,499,163 | 3/1996 | Sonntag et al. ................... 211/41.17 X |
| 5,508,887 | 4/1996 | Ozaki ...................................... 361/752 |
| 5,566,840 | 10/1996 | Waldner et al. ..................... 211/41.17 |
| 5,796,593 | 8/1998 | Mills et al. ....................... 211/41.17 X |
| 5,872,332 | 2/1999 | Verma .................................. 361/752 X |

*Primary Examiner*—Robert W. Gibson, Jr.
*Attorney, Agent, or Firm*—Wall Marjama Bilinski & Burr

[57] ABSTRACT

Apparatus for aligning and mounting a circuit board in a confined space that includes a pair of mounting pads extending outwardly from a wall. A tab is mounted on the wall over the pads so that a circuit board can be received between the pads and the tab. A rest mounted apart from the wall for supporting the board in a desired plane and a fastener for securing the board to the rest.

17 Claims, 6 Drawing Sheets

MOUNT FOR CIRCUIT BOARD

BACKGROUND OF THE INVENTION

This invention relates to mounting apparatus for an electronic circuit board and, in particular, to apparatus for mounting a circuit board in a relatively inaccessible or hard to each space.

As the air we breathe becomes more contaminated, the need for better, higher efficiency air purification equipment becomes more pronounced, particularly in the more densely populated areas. Much of the air pollution in these populated regions is caused by automobile exhaust emissions and industrial plants that burn fossil fuel in order to satisfy their power demands. This type of pollution is difficult to cleanse from the air and cannot be effectively handled by conventional filter found in furnace and air conditioning systems. As a consequence, people who suffer from respiratory ailments are oftentimes forced to remain indoors when the air quality drops below a certain safe value. Ideally, while indoors, these people should breathe air that has been circulated through a high efficiency air purifying system. These systems are, however, costly and not easily transported from place to place. The dependability and efficiency of presently available low cost, portable units, however, is generally less than satisfactory.

In many types of equipment, such as small air conditioners, air purifiers, dehumidifiers and the like, the electrical components for operating and controlling the equipment are contained on boards and the boards, in turn, mounted inside the unit. Because these units are typically compacted in order to save space, it is often extremely difficult to locate and mount the boards in the limited amount of available space allotted to the electrical components.

SUMMARY OF THE INVENTION

It is therefore an object of the present invention to improve compact air handling units equipped with circuit boards, and in particular, to a portable air purifier unit.

A further object of the present invention is to improve mounting apparatus for circuit boards.

A still further object of the present invention is to provide a circuit board mounting device that facilitates the mounting and removal of a circuit board from a hard to reach area.

Another object of the present invention is to simplify the mounting of a circuit board within a relatively inaccessible area.

These and other objects of the present invention are attained by means of an edge retainer for slidably receiving therein an edge of a circuit board and registering the edge of the board. A board rest is offset some distance from the retainer that has a fastening device associated therewith for securing the board to the rest. The board is easily mounted in a confined region by sliding the board into the retainer and then securing the registered board to the offset rest.

In one embodiment of the invention, the retainer includes a pair of pads mounted adjacent to a wall and an upper tab mounted over the pads. One edge of the board is slipped between the pads and tab into registration against the wall. The board is placed on the rest and secured thereto.

In another embodiment of the invention, a pair of retaining members having rectangular-shaped, horizontally-aligned notches formed therein are arranged to slidably receive a circuit board within the notches and register one edge of the board against the back wall of each notch. A rest is again offset apart from the retaining members and has a fastening device associated therewith for securing the registered board to the rest.

In a further embodiment of the invention, a rectangular slot is formed in a vertical wall for slidably receiving an edge of a circuit board therein in registration with the rear wall of the slot. A rest is offset from the wall and has a fastening device associated therewith for securing the registered board to the rest.

BRIEF DESCRIPTION OF THE DRAWINGS

For a better understanding of these and other objects of the present invention, reference will be made to the following detailed description of the invention which is to read in association with the accompanying drawings wherein.

DESCRIPTION OF THE INVENTION

Figure 1:
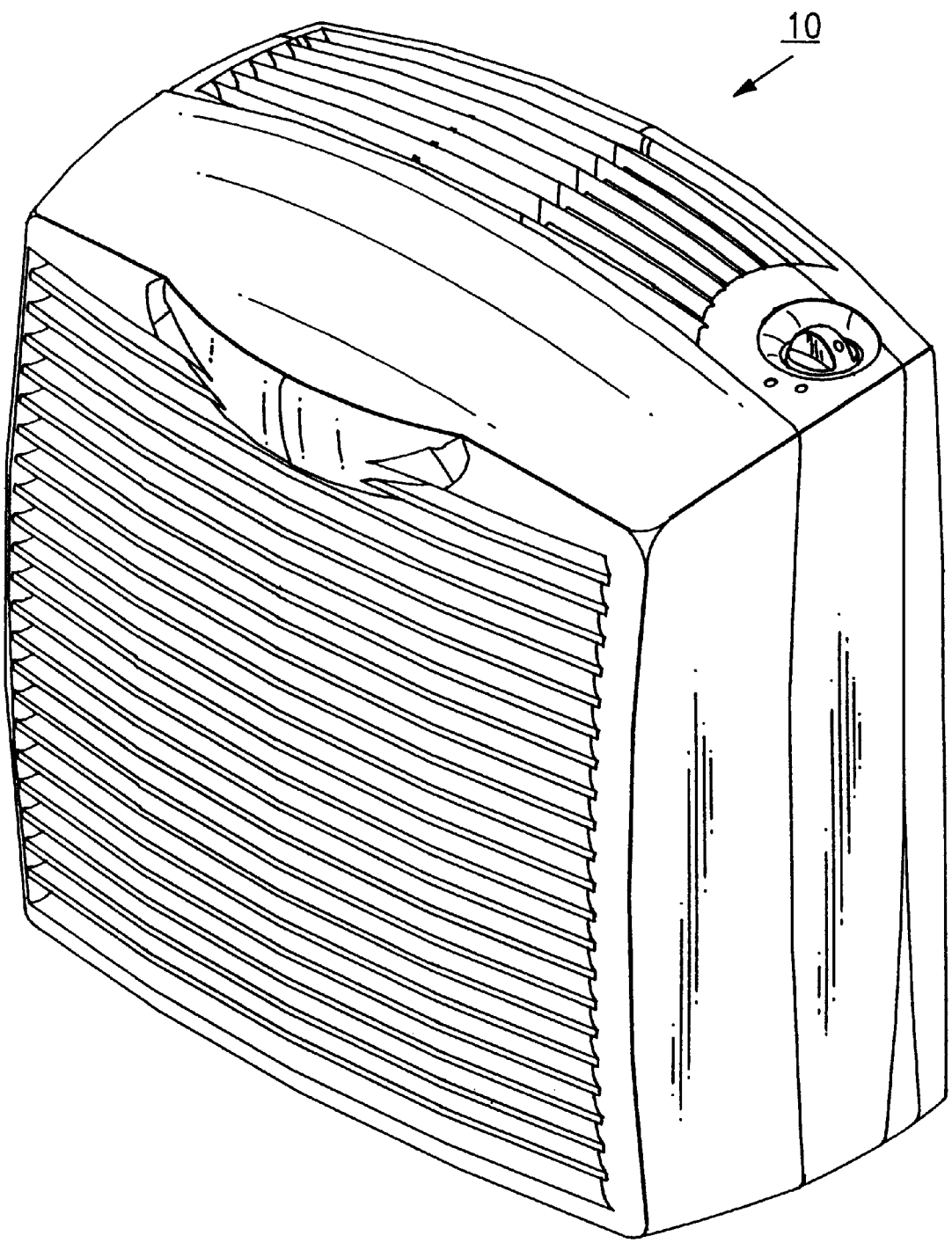
FIG. 1 is a perspective view of an air purification unit embodying the teachings of the present invention.
Figure 2:
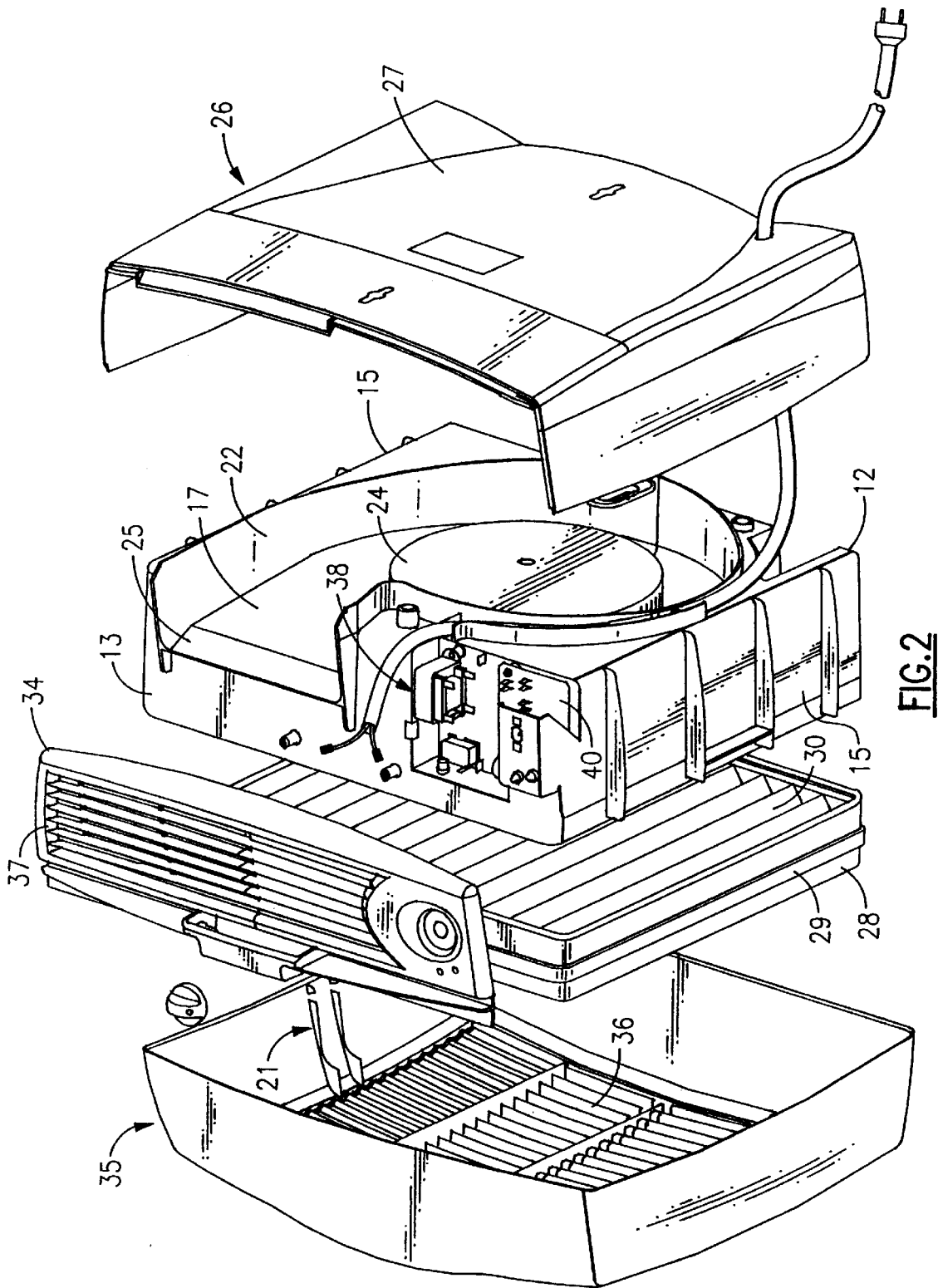
FIG. 2 is an exploded view in perspective of the air purification unit shown in FIG. 1.
Figure 3:
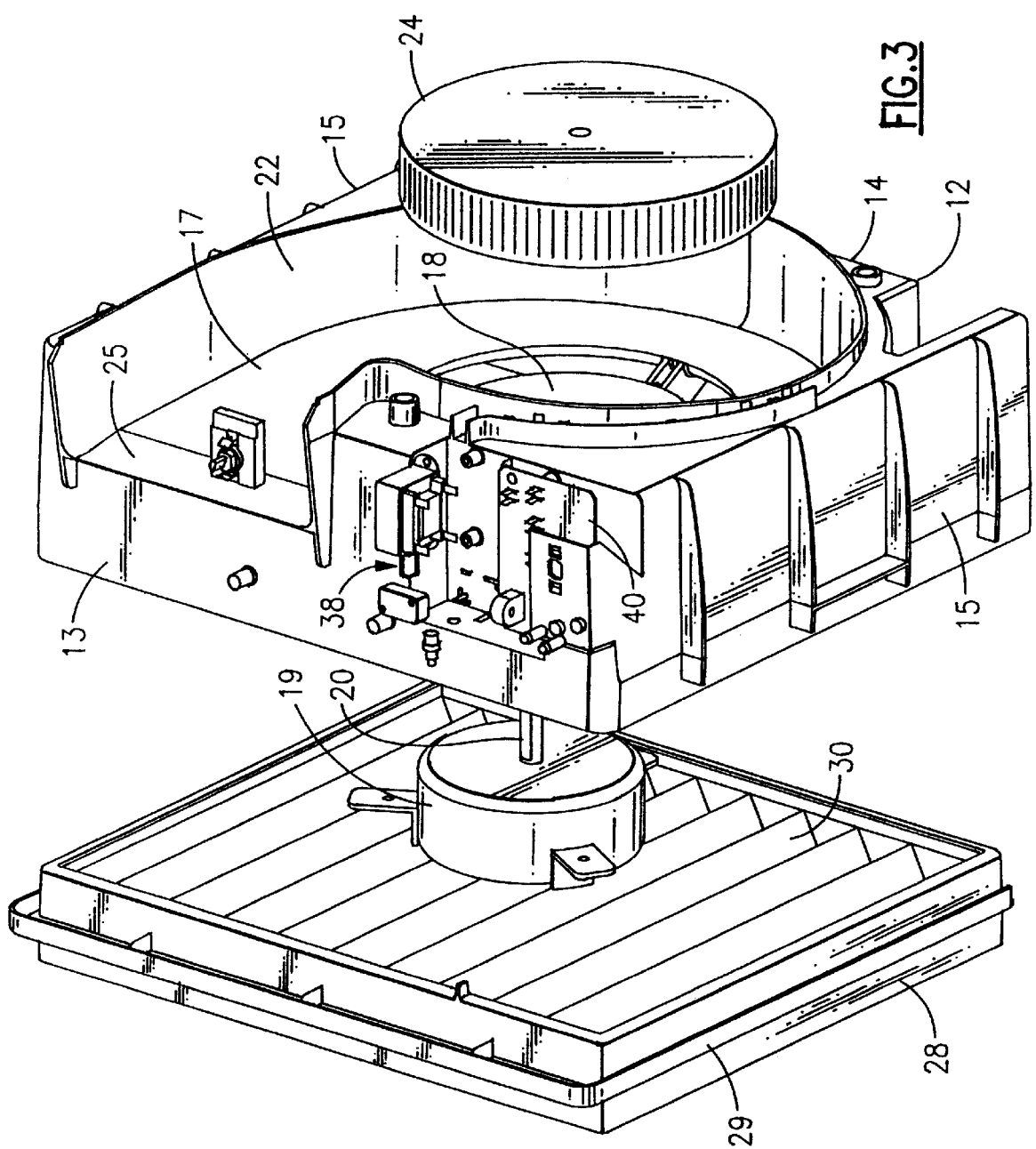
FIG. 3 is an enlarged, exploded view in perspective showing the main support member and the filter assembly of the air purification unit.
Figure 5:
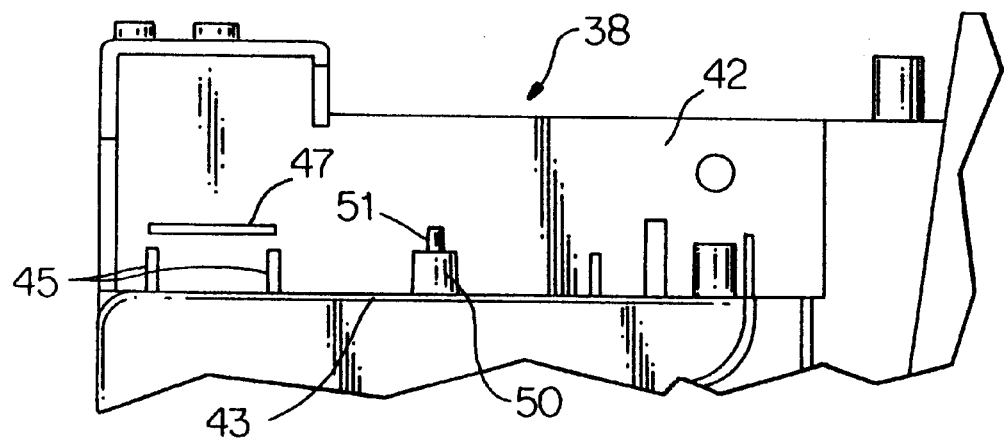
FIG. 5 is a partial front view of the electrical bay shown in FIG. 4 with the electronic circuit board removed.
Figure 4:
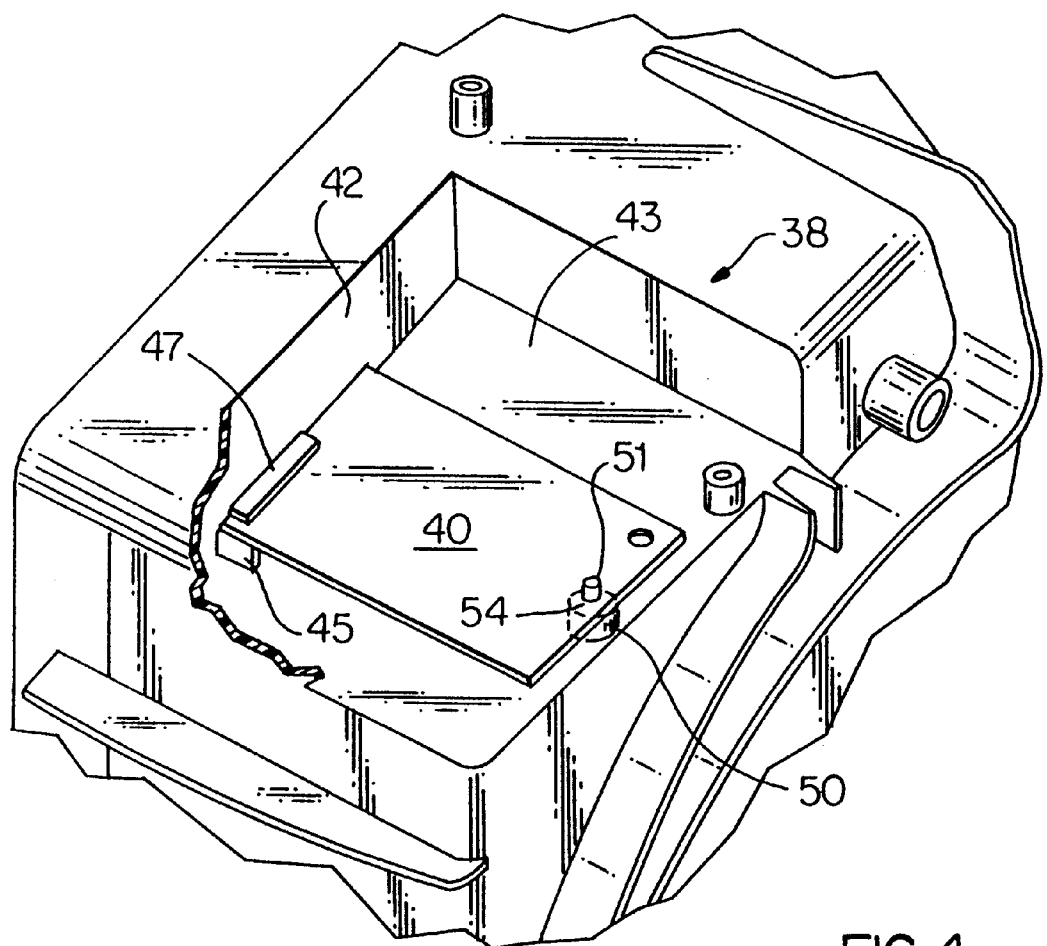
FIG. 4 is a partial top view in perspective showing the electrical bay located in the top wall of the main support member with portions broken away to show an electronic circuit board mounted therein.
Figure 6:
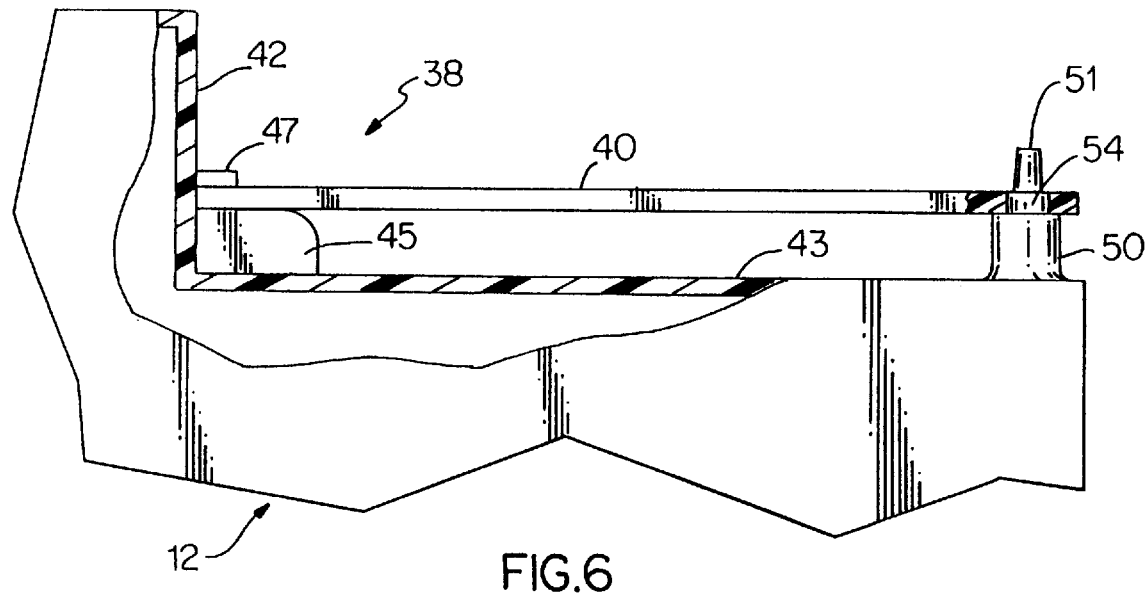
FIG. 6 is an enlarged side view of the electrical bay showing a circuit board mounted therein.
Figure 7:
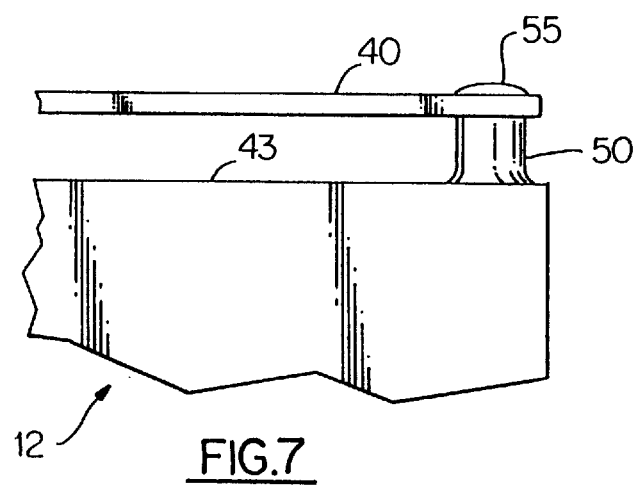
FIG. 7 is a partial side view of the bay illustrated in FIG. 6 further illustrating the circuit board fastened to a support rest.

Referring initially to FIGS. 1–4, there is shown a housing 10 containing a portable air purification unit. The covers of the housing and the components of the air purifier unit are all mounted upon a main support member 12 molded of a high strength plastic. The support member contains a top wall 13, a bottom wall 14 and a pair of opposed side walls 15. An interior wall 17 is integrally formed with the other walls of the support member and contains a central orifice 18. A motor 19 is mounted upon the front face of the interior wall. The motor shaft 20 passes through the orifice into a scroll 22 molded into the back face of the interior wall. A fan 24 is secured to the motor shaft inside the scroll and arranged to discharge air pulled through the orifice through a discharge opening 25 in the top wall of the main support member.

A rear cover 26 is secured to the main support frame which contains a back panel 27 that closes the back of the scroll and the discharge opening to provide a tight air passage therethrough.

A rectangular-shaped filter frame 28 is arranged to slidably fit into the front of the support frame. The frame contains a peripheral flange 29 that fits snugly over the front wall edges of the support for rendering the connection relatively air tight. An accordion-shaped, high efficiency particle arrestor (HEPA) filter 30 is sealed inside the filter frame for removing fine particles from the airstream drawn through the housing by the blower.

A top cover 34 is secured to the top wall of the support frame and a front cover 35 is removable on the main support member by means of a latching mechanism 21 thereby closing the housing about the main support member. An air inlet vent 36 is located in the front cover, while an air discharge vent 37 is located in the top cover.

An electrical bay 38 is recessed in the top wall of the support frame in which the electrical components of the air purifying system are housed. Among these components is an electronic circuit board 40. As can be seen, the space allotted for the board within the electrical bay is extremely limited and thus mounting and removing the board from the bay, under ordinary circumstances, is difficult.

Turning now more specifically to FIGS. 4–7, the electrical bay 38 contains a back wall 42 and a bottom wall 43. A pair of spaced apart mounting pads 45 are molded into the back wall and bottom wall of the bay so that the pads protrude outwardly from the back wall. An elongated tab member 47 is molded into the back wall of the bay which extends outwardly over each of the pads. The space provided between the tab and the pads is sufficient to permit a circuit board to be passed therebetween and the leading edge of the board to be registered against the back wall of the bay. The front corners of the pads are beveled to facilitate insertion of the board between the pads and the tabs. The pads, in addition, extend out from the rear wall a greater distance than the tab to enable the leading edge of the board to be initially placed on the pads and then guided between the pads and the tabs.

A cylindrical rest 50 is mounted on the bottom wall of the bay some distance from the back wall. A raised deformable pin 51 is in the rest that is arranged to pass through a hole 54 in the circuit board when the board is registered against the back wall of the electric bay. The height of the rest above the floor of the bay is about equal to that of the pads so that the board is supported thereon in a horizontal position.

The rest and the raised pin are integrally molded in the support member. In assembly, the top of the pin, which protrudes above the board, is thermally or physically deformed against the top of the board to form a head 55 that securely holds the board against the top of the rest. As should be now evident, this arrangement permits a circuit board to be easily slipped into position within a confined space and securely locked in place with a minimum amount of effort and without the use of special tools or the like. The board can be similarly removed for repair or replacing.

Figure 8:
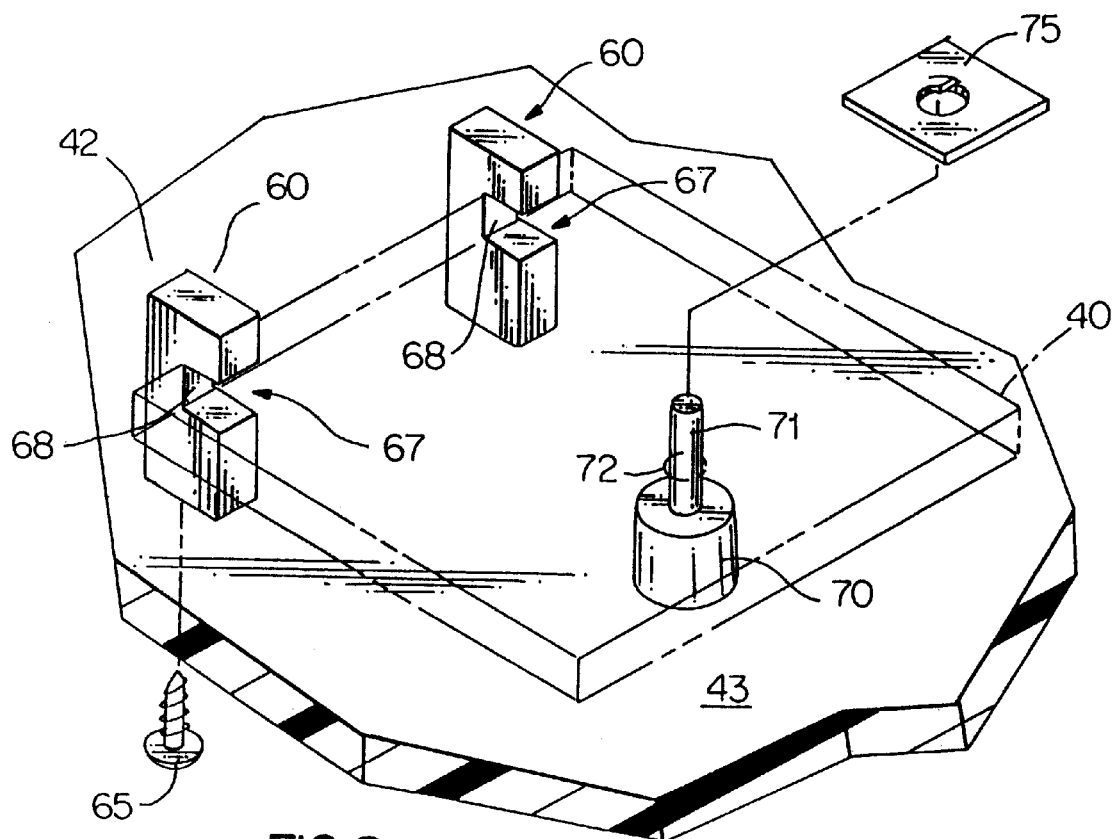
FIG. 8 is a partial view in perspective showing a second embodiment of the invention.

FIG. 8 depicts a further embodiment of the present invention wherein a pair of spaced-apart retaining members 60 are mounted against the back wall 42 of the electric bay. The retaining members are seated upon the floor 43 of the bay and are held in place by screws 65 passing through the back wall and floor of the bay. Each retaining member contains a rectangular notch 67 that passes inwardly through the front face of the member. The notches are horizontally aligned and are of the same size and shape to allow a circuit board 40 to be slidably received in the notches and registered against the back wall 68 of the notches. It should be understood that the notches 67 can have beveled edges at their entrances similar to those in FIG. 6.

A rest 70 is mounted some distance from the retaining members and contains a raised pin 71 that is adopted to pass upwardly through a hole 72 provided in the board. The top surface of the rest is coextensive with the bottom walls of the notches so that the rest supports the board in a horizontal position when it is registered against the back of the notches. The board is secured to the rest by means of a push nut 75 which is passed downwardly over the pin to lock the board against the rest.

Figure 9:
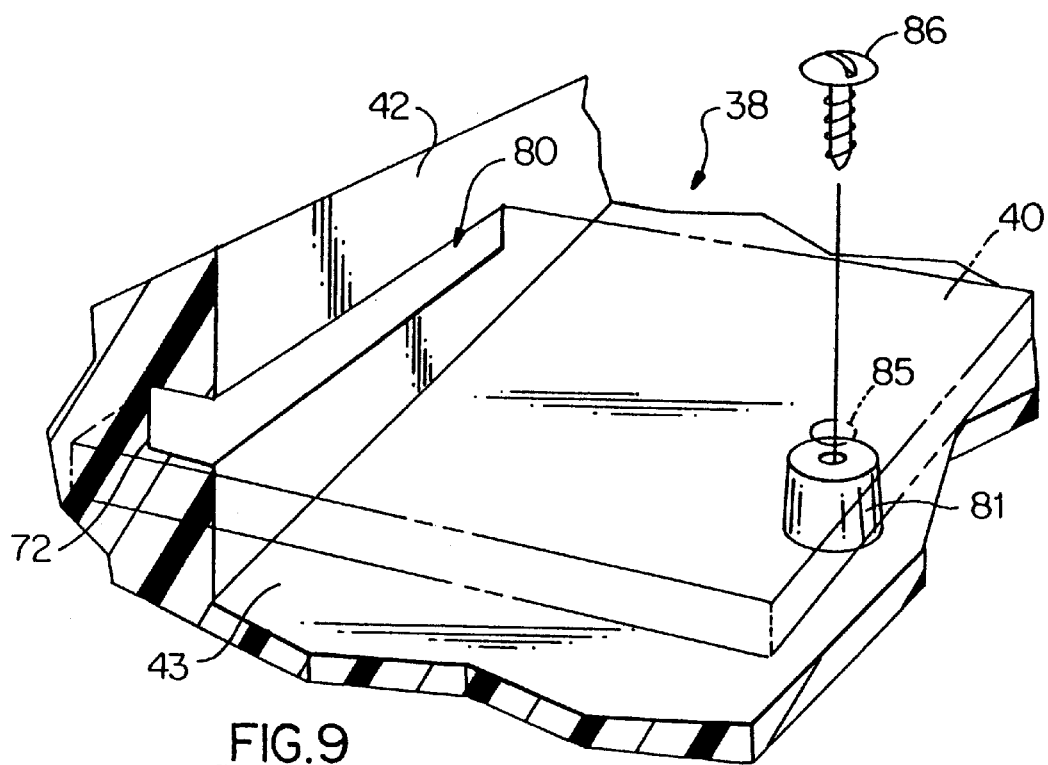
FIG. 9 is a partial view in perspective showing a third embodiment of the invention.

FIG. 9 depicts a still further embodiment of the invention wherein an elongated slot 80 is molded or otherwise formed in the back wall of the electric bay 38. The length and depth of the slot are such that a circuit board 40 can be received therein and the leading edge of the board registered against the back wall 72 of the slot. Here again a rest 81 is mounted on the floor of the electric bay. The top wall of the rest is coextensive with the bottom wall of the slot. A hole 85 is provided in the board which is axially-aligned with the rest and a screw 86 is passed through the hole and threaded into the rest to secure the registered board to the rest. While this invention has been explained with reference to the structure disclosed herein, it is not confined to the details set forth and this invention is intended to cover any modifications and changes as may come within the scope of the following claims:

What is claimed is:

1. Apparatus for mounting an electronic circuit board that includes
   a wall and at least one mounting pad protruding outwardly from said wall upon which a circuit board can be supported with one edge of the board registered against said wall,
   a tab mounted over said at least said one mounting pad for restricting the upward movement of a circuit board supported upon said pad,
   a rest spaced apart from said back wall for further supporting a circuit board that is seated upon said at least one mounting pad, and
   fastening means associated with said rest for securing a circuit board to said rest.

2. The apparatus of claim 1 that includes a first mounting pad and a second mounting pad.

3. The apparatus of claim 2 wherein each pad protrudes outwardly from the wall beyond said tab and has a beveled top front cover thereon.

4. The apparatus of claim 3 wherein said tab is an elongated member integral with said wall that passes over each of the mounting pads.

5. The apparatus of claim 1 wherein said fastening means is a screw that is threaded into said rest.

6. The apparatus of claim 1 wherein said fastening means is a raised pin that is integral with said rest and is arranged to pass through a hole in a circuit board that is supported upon the rest.

7. The apparatus of claim 6 wherein said pin is made of a deformable material whereby the pin can be deformed against a circuit board supported upon said rest.

8. The apparatus of claim 6 that further includes a push nut mounted upon the raised pin.

9. Apparatus for mounting an electronic circuit board in a hard to reach place that includes
   a pair of vertically disposed restraining members that are mounted in spaced-apart alignment,
   each of said restraining members containing a rectangular-shaped notch passing inwardly from its front wall, said notches being in horizontal alignment whereby a circuit board can be passed into said notches and registered against a back wall of each notch,
   a rest spaced-apart from said restraining members for supporting thereon a circuit board that is mounted in said notches of the restraining members, and
   fastening means associated with said rest for securing a circuit board that is supported thereon to said rest.

10. The apparatus of claim 9 wherein the entrance to each notch has beveled edges.

11. The apparatus of claim 9 wherein said fastening means is a screw that is threaded into said rest.

12. The apparatus of claim 9 wherein said fastening means is a raised pin that is integral with said rest that is arranged to pass through an opening in a circuit board and a push nut mounted upon said pin for holding said circuit board to said rest.

13. The apparatus of claim 12 wherein said pin is made of a deformable material that is deformed against a circuit board supported upon said rest to hold said board to said rest.

14. Apparatus for mounting an electric circuit board in a hard to reach place that includes a wall having a rectangular slot formed therein for receiving one edge of a circuit board therein, a rest spaced apart from said wall for supporting a board mounted in said slot thereon, and fastening means associated with said rest for securing a board to said rest.

15. The apparatus of claim 14 wherein said fastening means is a screw that is threaded into said rest.

16. The apparatus of claim 14 wherein said fastening means is a pin mounted in said rest that is arranged to pass through a board supported on said rest and a push nut mounted on said pin.

17. The apparatus of claim 14 wherein said fastening means includes a raised deformable pin integral with said rest arranged to pass through a hole in a board supported on said rest, said pin being wherein the pin is deformable into securing contact against a board supported upon the rest.

* * * * *